(12) United States Patent
Lin et al.

(10) Patent No.: US 9,007,067 B2
(45) Date of Patent: Apr. 14, 2015

(54) APPARATUS AND METHOD FOR ESTIMATING BATTERY CONDITION OF BATTERY PACK BY SOLELY MONITORING ONE SELECTED BATTERY CELL

(75) Inventors: Ming-Wei Lin, Hsinchu (TW);
Ming-Hsien Lee, Hsinchu (TW);
Ching-Liang Lin, Hsinchu (TW)

(73) Assignee: Energy Pass Incorporation, Hsinchu Science Park, Hsinchu (TW)

( * ) Notice: Subject to any disclaimer, the term of this patent is extended or adjusted under 35 U.S.C. 154(b) by 378 days.

(21) Appl. No.: 13/597,251

(22) Filed: Aug. 28, 2012

(65) Prior Publication Data
US 2014/0062494 A1 Mar. 6, 2014

(51) Int. Cl.
*G01N 27/416* (2006.01)
*H02J 7/00* (2006.01)
*H02J 7/04* (2006.01)
*G01R 31/36* (2006.01)
*H01M 10/42* (2006.01)
*H01M 10/48* (2006.01)
*G01R 19/165* (2006.01)

(52) U.S. Cl.
CPC ........ *G01R 31/3658* (2013.01); *H01M 10/4207* (2013.01); *H01M 10/482* (2013.01); *G01R 19/16542* (2013.01)

(58) Field of Classification Search
CPC ........... G01R 31/3658; G01R 31/3606; G01R 31/362; G01R 31/36
USPC ...................... 324/434; 320/132, 162; 702/63
See application file for complete search history.

(56) References Cited

U.S. PATENT DOCUMENTS

| | | | | |
|---|---|---|---|---|
| 6,081,154 | A * | 6/2000 | Ezell et al. ..................... | 327/540 |
| 7,471,016 | B2 * | 12/2008 | Stoicescu et al. ............. | 307/150 |
| 7,667,435 | B2 * | 2/2010 | Denning ........................ | 320/132 |
| 7,723,955 | B2 * | 5/2010 | Zaag et al. ..................... | 320/118 |
| 8,261,100 | B2 * | 9/2012 | Paniagua et al. .............. | 713/300 |
| 8,310,206 | B2 * | 11/2012 | Bucur ............................ | 320/134 |
| 8,324,861 | B2 * | 12/2012 | Huo et al. ...................... | 320/116 |
| 8,384,390 | B2 * | 2/2013 | Zhang ............................ | 324/429 |
| 8,405,512 | B2 * | 3/2013 | Johnson ........................ | 340/635 |
| 8,552,688 | B2 * | 10/2013 | Ueda et al. ..................... | 320/132 |
| 8,606,533 | B2 * | 12/2013 | Yen ................................. | 702/63 |
| 2006/0170398 | A1 * | 8/2006 | Gangsto et al. ............... | 320/132 |
| 2009/0184687 | A1 * | 7/2009 | Schroeder et al. ............ | 320/162 |

* cited by examiner

*Primary Examiner* — M'Baye Diao
(74) *Attorney, Agent, or Firm* — Winston Hsu; Scott Margo

(57) ABSTRACT

A battery condition estimating apparatus for a battery pack having a plurality of battery cells connected in series includes an analog channel switching circuit and a battery gas gauge circuit. The analog channel switching circuit has a plurality of input ports and an output port, wherein the input ports are coupled to the battery cells via a plurality of analog channels, respectively, and the analog channel switching circuit is arranged to couple the output port to a selected input port of the input ports for allowing the output port N5 to be coupled to a selected battery via a selected analog channel. The battery gas gauge circuit is coupled to the output port of the analog channel switching circuit, and used for estimating a battery condition of the battery pack by monitoring the selected battery cell via the selected analog channel.

18 Claims, 4 Drawing Sheets

APPARATUS AND METHOD FOR ESTIMATING BATTERY CONDITION OF BATTERY PACK BY SOLELY MONITORING ONE SELECTED BATTERY CELL

BACKGROUND OF THE INVENTION

1. Field of the Invention

The disclosed embodiments of the present invention relate to estimating a battery condition of a battery pack, and more particularly, to a battery condition estimating apparatus for estimating a battery condition of a battery pack by solely monitoring one selected battery cell and related method thereof.

2. Description of the Prior Art

A variety of electronic devices such as laptop computers, personal digital assistants, cell phones, etc. may be powered by a battery device. The battery device may employ a rechargeable battery of a variety of types such as a nickel cadmium, nickel metal hydride, or lithium ion. It is desirable for a user to be able to monitor the remaining charge on the battery device to know when recharging of the rechargeable battery is necessary. There are a variety of battery gas gauge techniques known in the art for estimating the remaining capacity of the battery device based on a variety of monitored conditions.

Consider a case where the rechargeable battery includes a battery pack with a plurality of battery cells connected in series. One conventional design is to measure a voltage value of each of the series-connected battery cells, and then determine the remaining battery capacity according to the measured voltage values. However, what the user is concerned about is the remaining capacity of the whole battery pack rather than the remaining capacity of each battery cell. Beside, as the battery cells included in the battery pack are connected in series, the remaining capacity of the battery pack is dominated by the remaining capacity of the worst battery cell. Hence, measuring voltage values of all series-connected battery cells is not an efficient way of determining the remaining capacity of the battery pack.

Another conventional design is to measure an average voltage value of the series-connected battery cells, and then determine the remaining battery capacity according to the measured average voltage value. As mentioned above, the remaining capacity of the battery pack is dominated by the remaining capacity of the worst battery cell. The determined remaining battery capacity is less accurate due to the fact that the measured average voltage value is unable to accurately reflect the actual condition of the worst battery cell.

Thus, there is a need for an innovative design which is capable of efficiently and accurately estimating a battery condition of a battery pack having series-connected battery cells included therein.

SUMMARY OF THE INVENTION

In accordance with exemplary embodiments of the present invention, a battery condition estimating apparatus for estimating a battery condition of a battery pack by solely monitoring one selected battery cell and related method thereof are proposed to solve the above-mentioned problems.

According to a first aspect of the present invention, an exemplary battery condition estimating apparatus for a battery pack having a plurality of battery cells connected in series is disclosed. The exemplary battery condition estimating apparatus includes an analog channel switching circuit and a battery gas gauge circuit. The analog channel switching circuit has a plurality of input ports and an output port, wherein the input ports are coupled to the battery cells via a plurality of analog channels, respectively, and the analog channel switching circuit is arranged to couple the output port to a selected input port of the input ports for allowing the output port to be coupled to a selected battery cell via a selected analog channel. The battery gas gauge circuit is coupled to the output port of the analog channel switching circuit, and used for estimating a battery condition of the battery pack by solely monitoring the selected battery cell via the selected analog channel.

According to a second aspect of the present invention, an exemplary battery condition estimating method applied to a battery pack having a plurality of battery cells connected in series is disclosed. The exemplary battery condition estimating method include the following steps: selecting one of a plurality of analog channels as a selected analog channel, wherein the analog channels are coupled to the battery cells, respectively; and utilizing a battery gas gauge circuit for estimating a battery condition of the battery pack by solely monitoring a selected battery cell via the selected analog channel.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
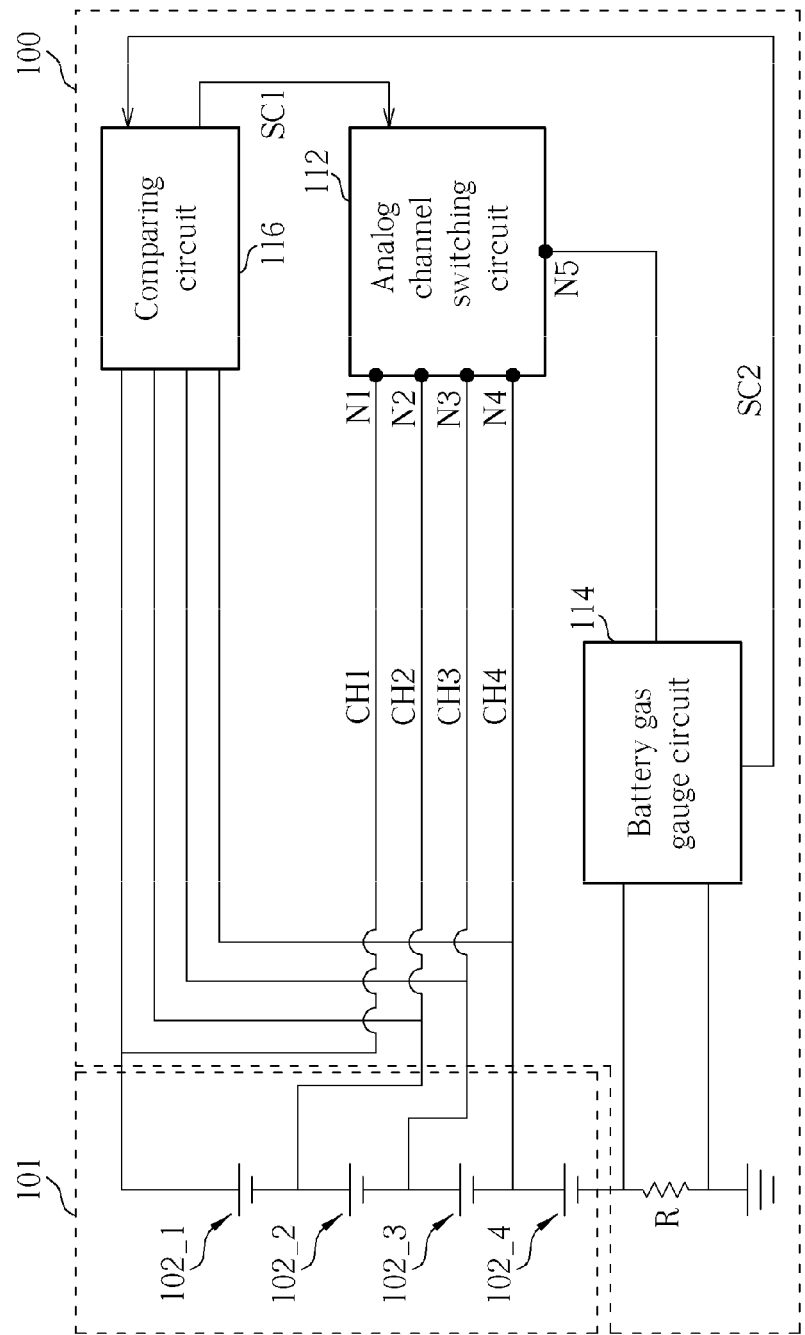
FIG. 1 is a block diagram illustrating a battery condition estimating apparatus according to a first exemplary embodiment of the present invention.

FIG. 1 is a block diagram illustrating a battery condition estimating apparatus according to a first exemplary embodiment of the present invention. The battery condition estimating apparatus 100 is used for estimating a battery condition of a battery pack 101 having a plurality of battery cells 102_1, 102_2, 102_3, 102_4 connected in series. By way of example, each of the battery cells 102_1-102_4 is rechargeable. It should be noted that the number of battery cells included in the battery pack 101 is for illustrative purposes only, and is not meant to be a limitation of the present invention. The battery condition estimating apparatus 100 includes, but is not limited to, an analog channel switching circuit 112, a battery gas gauge circuit (e.g., a battery gas gauge chip) 114, and a comparing circuit 114. In this exemplary embodiment, the analog channel switching circuit 112 may be an analog circuit operating in an analog domain, and has a plurality of input ports N1, N2, N3, N4 and an output port N5, where the input ports N1-N4 are coupled to the battery cells 102_1-102_N via a plurality of analog channels CH1, CH2, CH3, CH4, respectively. The analog channel switching circuit 112 is arranged to couple the output port N5 to a selected input port of the input ports N1-N4 for allowing the output port N5 to be coupled to a selected battery via a selected analog channel. The battery gas gauge circuit 114 is coupled to the output port N5 of the analog channel switching circuit 112, and is used for estimating a battery condition of the battery pack 101 by solely monitoring the selected battery cell via the selected analog channel. For example, when the battery cell 102_1 is the worst battery cell among the battery cells due to having a lowest voltage (e.g., a lowest open circuit voltage), the battery cell 102_1 is regarded as the selected battery cell mentioned above. Therefore, the output port N5 is coupled to the input port N1, thus allowing the output port N5 to be coupled to the selected battery cell (i.e., the battery cell 102_1) via the analog channel N1 acting as the selected analog channel.

By way of example, but not limitation, the estimated battery condition may be a state of charge (SOC) derived from analyzing the voltage value of the selected battery cell. In addition, the battery gas gauge circuit 114 may also be coupled to a resistor R with a predetermined resistance value for measuring a current value of the battery pack 101.

As the battery cells 102_1-102_4 are connected in series, the remaining capacity of the battery pack 101 is dominated by the remaining capacity of the worst battery cell. Based on such an observation, the present invention proposes utilizing the battery gas gauge circuit 114 to merely measure the battery cell 102_1, and determine the battery condition of the battery pack 101 according to at least a measurement result of the battery cell 102_1. As the battery gas gauge circuit 114 is arranged to measure the worst battery cell for estimating the battery condition of the battery pack 101, the comparing circuit 116 is therefore implemented for determining which one of the series-connected battery cells 102_1-102_4 is the worst battery cell.

In this exemplary embodiment, the comparing circuit 116 is coupled to the battery cells 102_1-102_4, and arranged for performing comparison upon the battery cells 102_1-102_4 to determine the worst battery cell (e.g., the battery cell 102_1) as the selected battery cell to be monitored by the battery gas gauge circuit 114, and accordingly generating a control signal SC1 to the analog channel switching circuit SC1. The analog channel switching circuit 112 couples the output port N5 to the selected input port (e.g., the input port N1) in response to the control signal SC1. By way of example, but not limitation, the comparing circuit 116 may be an analog circuit operating in an analog domain, and therefore performs comparison upon the battery cells 102_1-102_4 without measuring actual voltage values (i.e., digital voltage levels) of the battery cells 102_1-102_4. For example, the comparing circuit 116 may be simply realized by operational amplifiers for comparing analog voltages obtained from the battery cells 102_1-102_4. To put it simply, as the comparing circuit 116 may be configured to determine which one of the battery cells 102_1-102_4 has the lowest voltage without measuring the actual voltage values of the battery cells 102_1-102_4, the implementation of the comparing circuit 116 may be simplified.

When the battery pack 101 is fully charged to its maximum capacity, the discrepancy between voltages of the battery cells 102_1-102_4 is small. However, after the battery pack 101 has been discharged for a period of time, the discrepancy between voltages of the battery cells 102_1-102_4 would be enlarged. Based on such an observation, the battery gas gauge circuit 114 generates a control signal SC2 for instructing the comparing circuit 116 to start performing comparison upon the battery cells 102_1-102_4 when detecting that the battery condition of the battery pack 101 satisfies a predetermined criterion. For example, the predetermined criterion is satisfied when SOC of the battery pack 101 is found lower than a predetermined threshold. In one exemplary design, the predetermined threshold may be 30%. However, this is for illustrative purposes only, and is not meant to be a limitation of the present invention.

The comparing circuit 116 is instructed to compare analog voltages of the battery cells 102_1-102_4 each time the SOC of the battery pack 101 is below the predetermined threshold. Therefore, as the battery cells 102_1-102_4 have been discharged for a period of time after the SOC of the battery pack 101 is found lower than the predetermined threshold, the discrepancy between voltages of the battery cells 102_1-102_4 would be significant, thus facilitating the detection of the worst battery cell.

Figure 2:
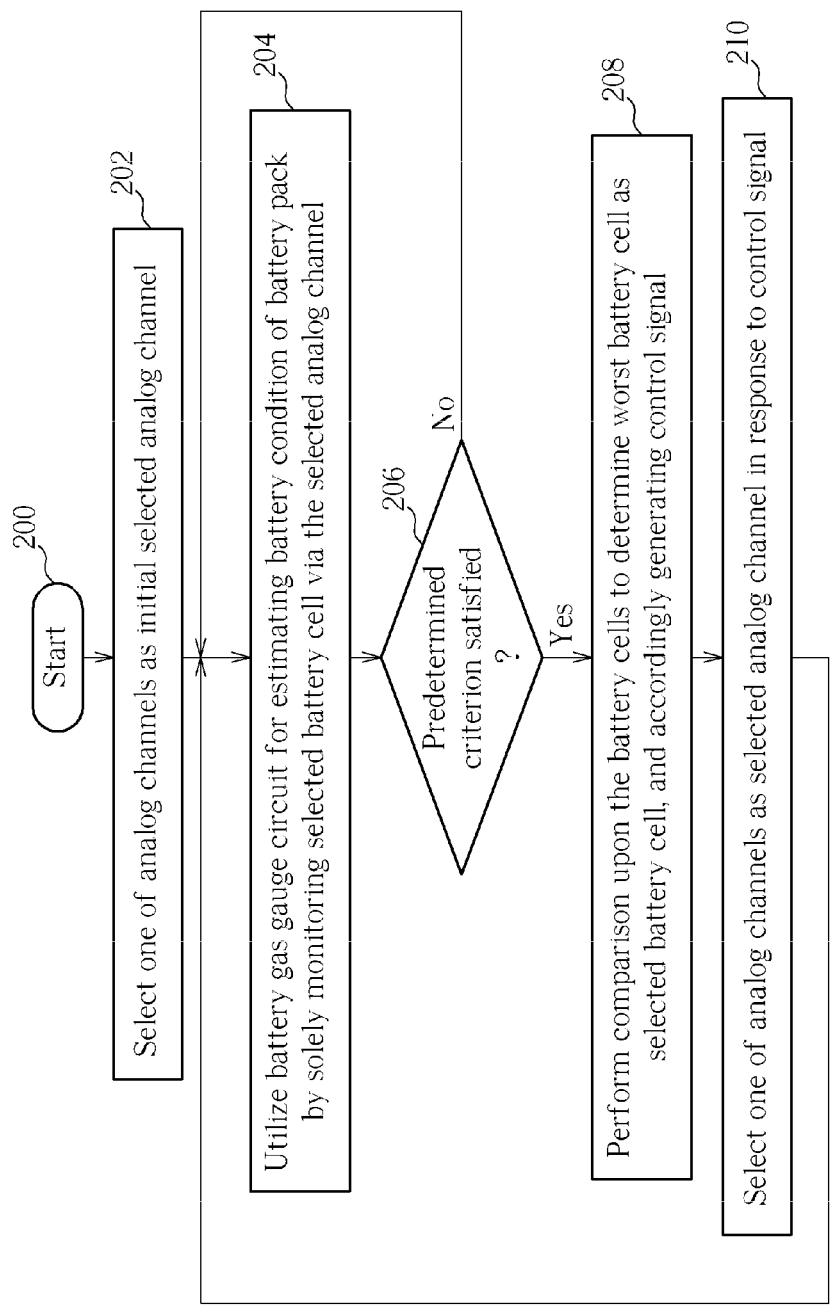
FIG. 2 is a flowchart illustrating a battery condition estimating method according to a first exemplary embodiment of the present invention.

FIG. 2 is a flowchart illustrating a battery condition estimating method according to a first exemplary embodiment of the present invention. Provided that the result is substantially the same, the steps are not required to be executed in the exact order shown in FIG. 2. The battery condition estimating method may be employed by the battery condition estimating apparatus 100 shown in FIG. 1, and can be briefly summarized as below.

Step 200: Start.

Step 202: Select one of a plurality of analog channels as an initial selected analog channel.

Step 204: Utilize a battery gas gauge circuit for estimating a battery condition of a battery pack by solely monitoring a selected battery cell via the selected analog channel.

Step 206: Check if the battery condition of the battery pack satisfies a predetermined criterion. If yes, go to step 208; otherwise, go to step 204 to keep monitoring the selected battery cell.

Step 208: Perform comparison upon the battery cells to determine a worst battery cell as a selected battery cell, and accordingly generating a control signal.

Step 210: Select one of the analog channels as a selected analog channel in response to the control signal, where the selected analog channel may be identical to or different from the previous selected analog channel. Go to step 204.

When the battery pack 101 is initially used in an electronic device (i.e., the battery pack 101 operates in the discharging mode for the first time), the initial selected analog channel may be randomly selected from the analog channels for allowing the battery gas gauge circuit 114 to monitor the battery condition of the battery pack 101. Therefore, the analog channel switching circuit 112 initially couples the output port N5 to any of the input ports N1-N4, and latches the selected analog channel correspondingly. Alternatively, though the discrepancy of the voltages of the battery cells 102_1-102_4 may be small in the beginning, the comparing circuit 116 may be activated to find the worst battery cell for setting the initial selected analog channel. When the battery condition of the battery pack satisfies the predetermined criterion, the comparing circuit 116 would be instructed to determine whether the selected analog channel should remain unchanged or should be updated by another analog channel.

Figure 3:
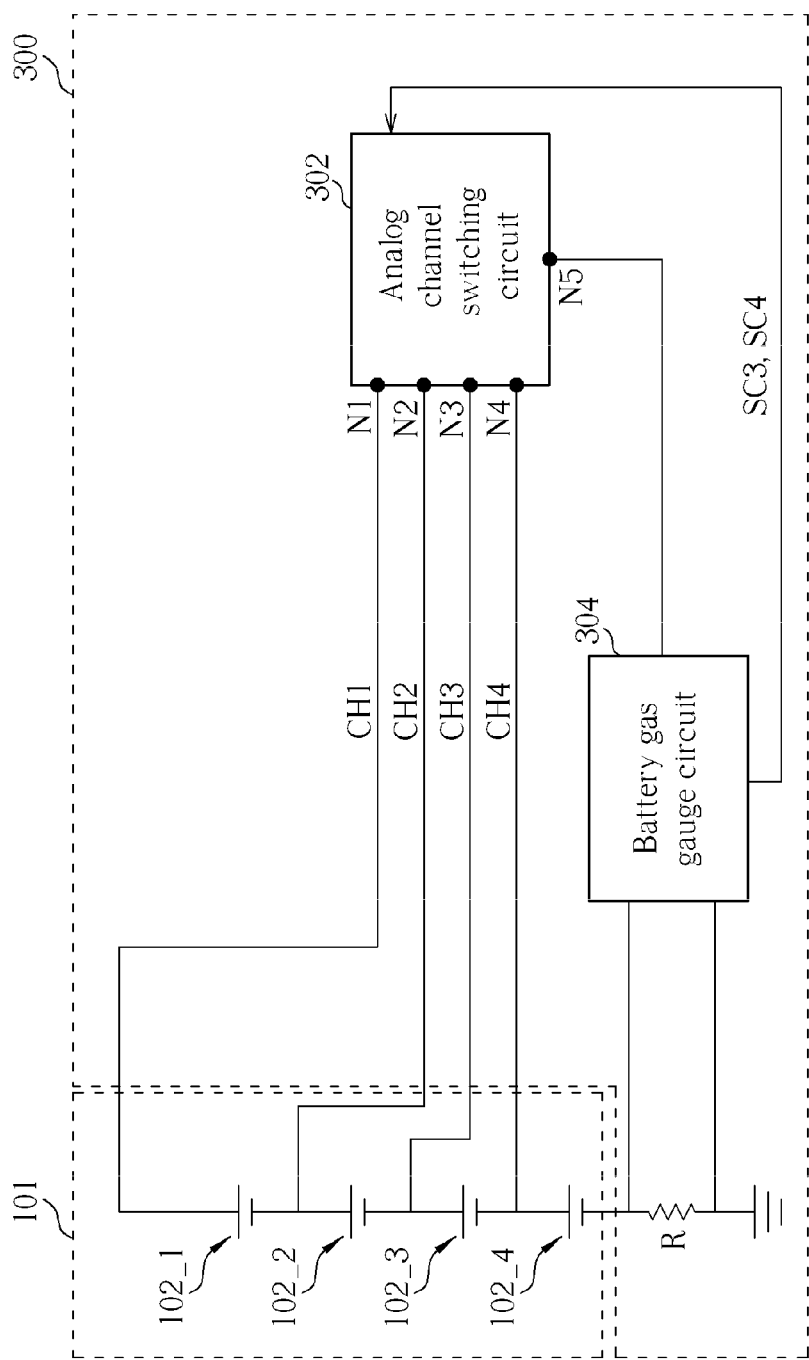
FIG. 3 is a block diagram illustrating a battery condition estimating apparatus according to a second exemplary embodiment of the present invention.

FIG. 3 is a block diagram illustrating a battery condition estimating apparatus according to a second exemplary embodiment of the present invention. The battery condition estimating apparatus 300 may also be used for estimating the battery condition of the aforementioned battery pack 101. The battery condition estimating apparatus 300 includes, but is not limited to, an analog channel switching circuit 302 and a battery gas gauge circuit (e.g., a battery gas gauge chip) 304. In this exemplary embodiment, the analog channel switching circuit 302 may be an analog circuit operating in an analog domain, and has a plurality of input ports N1-N4 and an output port N5, where the input ports N1-N4 are coupled to the battery cells 102_1-102_N via analog channels CH1-CH4, respectively. The analog channel switching circuit 302 is arranged to couple the output port N5 to a selected input port of the input ports N1-N4 for allowing the output port N5 to be coupled to a selected battery via a selected analog channel. The battery gas gauge circuit 304 is coupled to the output port N5 of the analog channel switching circuit 302, and is used for estimating the battery condition of the battery pack 101 by solely monitoring the selected battery cell via the selected analog channel.

For example, when the battery cell 102_1 is the worst battery cell among the battery cells due to having a lowest voltage (e.g., a lowest open circuit voltage), the battery cell 102_1 is regarded as the selected battery cell. Therefore, the output port N5 is coupled to the input port N1, thus allowing the output port N5 to be coupled to the selected battery cell (i.e., the battery cell 102_1) via the analog channel N1 acting as the selected analog channel. As the battery cells 102_1-102_4 are connected in series, the remaining capacity of the battery pack 101 is dominated by the remaining capacity of the worst battery cell. The present invention therefore proposes utilizing the battery gas gauge circuit 304 to merely measure the battery cell 102_1, and determine the battery condition of the battery pack 101 according to at least a measurement result of the battery cell 102_1.

The major difference between the battery condition estimating apparatuses 100 and 300 is that the battery gas gauge circuit 304 is responsible for deciding which one of the battery cells 102_1-102_4 is the worst battery cell. In this exemplary embodiment, the battery gas gauge circuit 304 performs a polling operation upon the analog channels CH1-CH4 to determine the selected battery cell by generating a control signal SC3 to instruct the analog channel switching circuit 302 to couple the output port N5 to the input ports N1-N4 alternately, and accordingly generates a control signal SC4 to the analog channel switching circuit 302. The analog channel switching circuit 302 couples the output port N5 to the selected input port in response to the control signal SC4. For example, the battery gas gauge circuit 304 measures actual voltage values (i.e., digital voltage levels) of the battery cells 102_1-102_4 when the analog channels CH1-CH4 are used one by one during the polling operation, and then determines the worst battery cell having the lowest voltage according to the measured voltage values. When the worst battery cell (e.g., the battery cell 102_1) is decided, the analog channel switching circuit 302 couples the output port N5 to the selected input port (e.g., the input port N1) in response to the control signal SC4, thereby latching the selected analog channel (e.g., the analog channel CH1).

As mentioned above, when the battery pack 101 is fully charged to its maximum capacity, the discrepancy between voltages of the battery cells 102_1-102_4 is small. Therefore, the battery gas gauge circuit 304 generates the control signal SC3 for enabling the polling operation performed upon the analog channels CH1-CH4 2 when detecting that the battery condition of the battery pack 101 satisfies a predetermined criterion. For example, the predetermined criterion is satisfied when the SOC of the battery pack 101 is found lower than a predetermined threshold. By way of example, but not limitation, the predetermined threshold may be 30%. In other words, the analog channel switching circuit 302 is instructed to couple the output node N5 to the input ports N1-N4 alternately each time the SOC of the battery pack 101 is found lower than the predetermined threshold. Therefore, as the battery cells 102_1-102_4 have been discharged for a period of time after SOC of the battery pack 101 is below the predetermined threshold, the discrepancy between voltages of the battery cells 102_1-102_4 would be significant, thus facilitating the detection of the worst battery cell.

Figure 4:
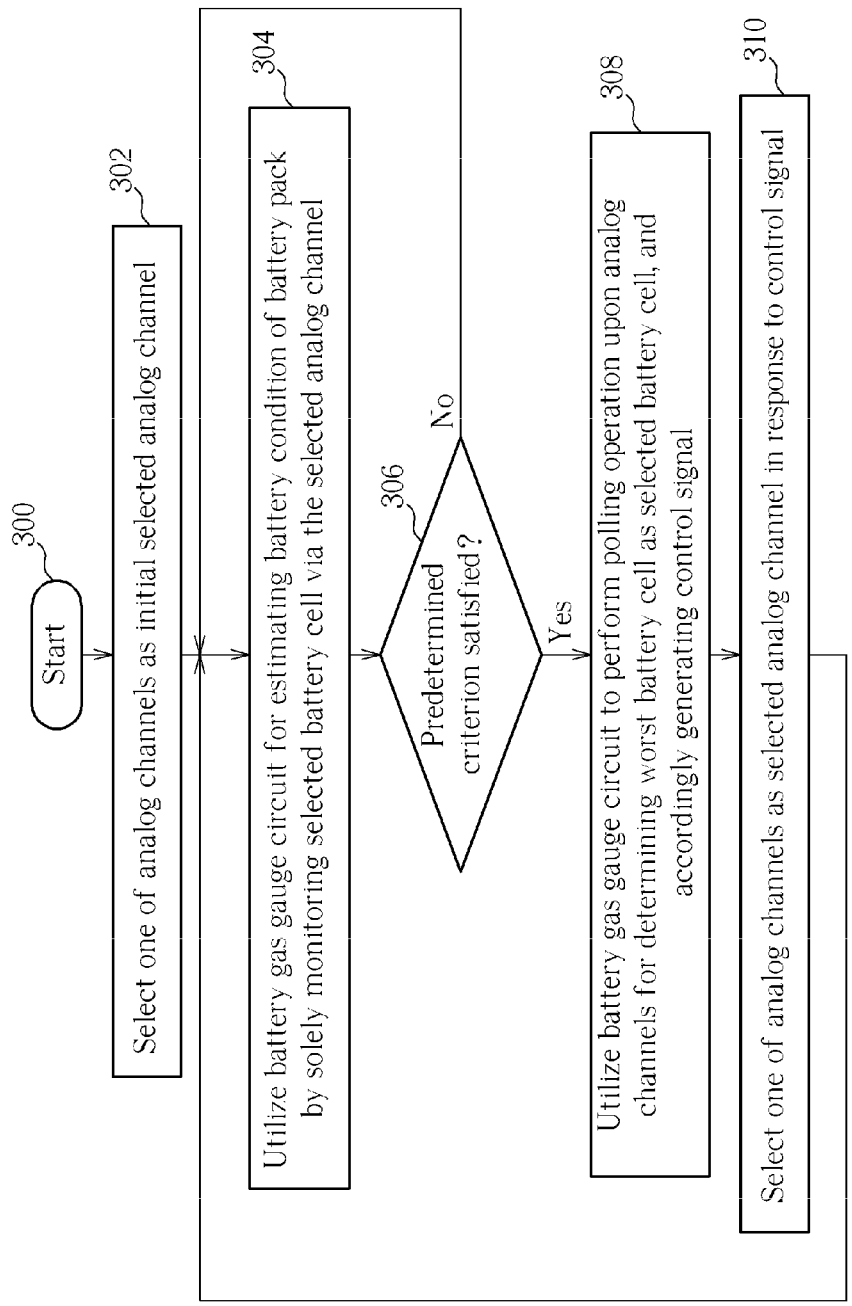
FIG. 4 is a flowchart illustrating a battery condition estimating method according to a second exemplary embodiment of the present invention.

FIG. 4 is a flowchart illustrating a battery condition estimating method according to a first exemplary embodiment of the present invention. Provided that the result is substantially the same, the steps are not required to be executed in the exact order shown in FIG. 4. The battery condition estimating method may be employed by the battery condition estimating apparatus 300 shown in FIG. 3, and can be briefly summarized as below.

Step 300: Start.

Step 302: Select one of a plurality of analog channels as an initial selected analog channel.

Step 304: Utilize a battery gas gauge circuit for estimating a battery condition of a battery pack by solely monitoring a selected battery cell via the selected analog channel.

Step 306: Check if the battery condition of the battery pack satisfies a predetermined criterion. If yes, go to step 308; otherwise, go to step 304 to keep monitoring the selected battery cell.

Step 308: Utilize the battery gas gauge circuit to perform a polling operation upon analog channels for determining a worst battery cell as a selected battery cell, and accordingly generating a control signal.

Step 310: Select one of the analog channels as a selected analog channel in response to the control signal, where the selected analog channel may be identical to or different from the previous selected analog channel. Go to step 304.

The operation of the exemplary flow shown in FIG. 4 is identical to the exemplary flow shown in FIG. 3 except the detection of the worst battery cell. As a person skilled in the pertinent art can readily understand operations the steps shown in FIG. 4 after reading above paragraphs, further description is omitted here for brevity.

It should be noted that the detection of the worst battery cell is performed when the battery pack 101 operates in the discharging mode. Hence, when the battery pack 101 operates in the charging mode, the selected analog channel latched by the analog channel switching circuit 112/302 is not changed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A battery condition estimating apparatus for a battery pack having a plurality of battery cells connected in series, comprising:

an analog channel switching circuit, having a plurality of input ports and an output port, wherein the input ports are coupled to the battery cells via a plurality of analog channels, respectively, and the analog channel switching circuit is arranged to couple the output port to a selected input port of the plurality of input ports for allowing the output port to be coupled to a selected battery cell via a selected analog channel;

a battery gas gauge circuit, coupled to the output port of the analog channel switching circuit, for estimating a battery condition of the battery pack by solely monitoring the selected battery cell via the selected analog channel; and a comparing circuit, coupled to the battery cells and the analog channel switching circuit, for performing comparison upon the battery cells to determine the selected battery cell, and accordingly generating a control signal to the analog channel switching circuit, wherein the analog channel switching circuit couples the output port to the selected input port in response to the control signal.

2. The battery condition estimating apparatus of claim 1, wherein the comparing circuit determines a battery cell having a lowest voltage among voltages of the plurality of battery cells as the selected battery cell.

3. The battery condition estimating apparatus of claim 1, wherein the comparing circuit performs the comparison upon the battery cells without measuring actual voltage values of the battery cells.

4. The battery condition estimating apparatus of claim 1, wherein the battery gas gauge circuit instructs the comparing circuit to perform comparison upon the battery cells when detecting that the battery condition of the battery pack satisfies a predetermined criterion.

5. The battery condition estimating apparatus of claim 4, wherein the predetermined criterion is satisfied when a state of charge (SOC) of the battery pack is found lower than a predetermined threshold.

6. A battery condition estimating apparatus for a battery pack having a plurality of battery cells connected in series, comprising:

an analog channel switching circuit, having a plurality of input ports and an output port, wherein the input ports are coupled to the battery cells via a plurality of analog channels, respectively, and the analog channel switching circuit is arranged to couple the output port to a selected input port of the plurality of input ports for allowing the output port to be coupled to a selected battery cell via a selected analog channel; and a battery gas gauge circuit, coupled to the output port of the analog channel switching circuit, for estimating a battery condition of the battery pack by solely monitoring the selected battery cell via the selected analog channel;

wherein the battery gas gauge circuit performs a polling operation upon the analog channels to determine the selected battery cell by instructing the analog channel switching circuit to couple the output port to the input ports alternately, and accordingly generates a control signal to the analog channel switching circuit, wherein the analog channel switching circuit couples the output port to the selected input port in response to the control signal.

7. The battery condition estimating apparatus of claim 6, wherein the comparing circuit determines a battery cell having a lowest voltage among voltages of the plurality of battery cells as the selected battery cell.

8. The battery condition estimating apparatus of claim 6, wherein the battery gas gauge circuit instructs the analog channel switching circuit to couple the output port to the input ports alternately when detecting that the battery condition of the battery pack satisfies a predetermined criterion.

9. The battery condition estimating apparatus of claim 8, wherein the predetermined criterion is satisfied when a state of charge (SOC) of the battery pack is found lower than a predetermined threshold.

10. A battery condition estimating method applied to a battery pack having a plurality of battery cells connected in series, comprising:

selecting one of a plurality of analog channels as a selected analog channel, wherein the plurality of analog channels are coupled to the plurality of battery cells, respectively;

utilizing a battery gas gauge circuit for estimating a battery condition of the battery pack by solely monitoring a selected battery cell via the selected analog channel; and performing comparison upon the battery cells to determine the selected battery cell, and accordingly generating a control signal, wherein the selecting step selects one of the analog channels in response to the control signal.

11. The battery condition estimating method of claim 10, wherein the worst battery cell has a lowest voltage a battery cell having a lowest voltage among voltages of the plurality of battery cells is determined as the selected battery cell.

12. The battery condition estimating method of claim 10, wherein the comparison performed upon the battery cells does not measure actual voltage values of the battery cells.

13. The battery condition estimating method of claim 10, further comprising:

when the battery gas gauge circuit detects that the battery condition of the battery pack satisfies a predetermined criterion, enabling the step of performing the comparison upon the battery cells.

14. The battery condition estimating method of claim 13, wherein the predetermined criterion is satisfied when a state of charge (SOC) of the battery pack is found lower than a predetermined threshold.

15. A battery condition estimating method applied to a battery pack having a plurality of battery cells connected in series, comprising:

selecting one of a plurality of analog channels as a selected analog channel, wherein the plurality of analog channels are coupled to the plurality of battery cells, respectively;

utilizing a battery gas gauge circuit for estimating a battery condition of the battery pack by solely monitoring a selected battery cell via the selected analog channel; and utilizing the battery gas gauge circuit to perform a polling operation upon the analog channels for determining the selected battery cell by switching between the analog channels alternately, and accordingly generate a control signal, wherein the selecting step selects one of the analog channels in response to the control signal.

16. The battery condition estimating method of claim 15, wherein a battery cell having a lowest voltage among voltages of the plurality of battery cells is determined as the selected battery cell.

17. The battery condition estimating method of claim 15, further comprising:

when the battery gas gauge circuit detects that the battery condition of the battery pack satisfies a predetermined criterion, enabling the step of utilizing the battery gas gauge circuit to perform the polling operation upon the analog channels.

18. The battery condition estimating method of claim 17, wherein the predetermined criterion is satisfied when a state of charge (SOC) of the battery pack is found lower than a predetermined threshold.

* * * * *